United States Patent
Schleicher

(10) Patent No.: US 10,079,197 B2
(45) Date of Patent: Sep. 18, 2018

(54) ENCAPSULATED POWER SEMICONDUCTOR DEVICE HAVING A METAL MOULDED BODY AS A FIRST CONNECTING CONDUCTOR

(71) Applicant: SEMIKRON ELEKTRONIK GMBH & CO. KG, Nürnberg (DE)

(72) Inventor: Michael Schleicher, Eriangen (DE)

(73) Assignee: SEMIKRON ELEKTRONIK GmbH & CO. KG, Nuremberg (DE)

( * ) Notice: Subject to any disclaimer, the term of this patent is extended or adjusted under 35 U.S.C. 154(b) by 0 days.

(21) Appl. No.: 15/452,020

(22) Filed: Mar. 7, 2017

(65) Prior Publication Data
US 2017/0263530 A1 Sep. 14, 2017

(30) Foreign Application Priority Data
Mar. 9, 2016 (DE) .......................... 10 2016 104 284

(51) Int. Cl.
*H01L 23/427* (2006.01)
*H01L 23/06* (2006.01)
(Continued)

(52) U.S. Cl.
CPC ............ *H01L 23/427* (2013.01); *H01L 23/06* (2013.01); *H01L 23/3121* (2013.01);
(Continued)

(58) Field of Classification Search
CPC .................... H01L 23/06; H01L 25/07–25/074
See application file for complete search history.

(56) References Cited

U.S. PATENT DOCUMENTS

| | | | |
|---|---|---|---|
| 2007/0211426 A1* | 9/2007 | Clayton | H01L 23/473 361/689 |
| 2011/0198743 A1* | 8/2011 | Nikitin | H01L 23/492 257/690 |
| 2013/0146991 A1* | 6/2013 | Otremba | H01L 25/071 257/401 |

FOREIGN PATENT DOCUMENTS

DE 10 2011 000 751 12/2011
EP 2881985 6/2015

OTHER PUBLICATIONS

DE 10 2011 000 751, Examination Report dated Jun. 24 2016, 6 pages—English, 6 pages—German.

* cited by examiner

*Primary Examiner* — Thao X Le
*Assistant Examiner* — Gardner W Swan
(74) *Attorney, Agent, or Firm* — Lackenbach Siegel, LLP; Andrew F. Young

(57) ABSTRACT

A power semiconductor device has a metal molded body forming a first connecting conductor. From a first main surface of the metal molded body there is a first recess having a first base in which a first power semiconductor component is arranged which faces the first base and is connected in an electrically conductive manner. From a second main surface of the metal molded body, a second recess has a second base, and a second power semiconductor component is arranged with the first contact surface thereof associated with the second base connected in an electrically conductive manner to this base. An insulating material layer is on both main surfaces, filling and completely covering the recess, wherein the first insulating layer has an electrically conductive first via which connects a second contact surface of the first power semiconductor component in an electri- (Continued)

cally conductive manner to a first conducting surface arranged on the first insulating layer.

10 Claims, 4 Drawing Sheets

(51) Int. Cl.
    *H01L 23/31*          (2006.01)
    *H01L 23/522*       (2006.01)
    *H01L 23/528*       (2006.01)
    *H01L 25/065*       (2006.01)

(52) U.S. Cl.
    CPC ........ *H01L 23/528* (2013.01); *H01L 23/5226* (2013.01); *H01L 25/0652* (2013.01)

ENCAPSULATED POWER SEMICONDUCTOR DEVICE HAVING A METAL MOULDED BODY AS A FIRST CONNECTING CONDUCTOR

CROSS REFERENCE TO RELATED APPLICATIONS

This application relates to, and claims priority from, German Ser. No.: DE 10 2016 104 284.6 filed Mar. 9, 2016, the entire contents of which are incorporated herein by reference.

FIGURE SELECTED FOR PUBLICATION

FIG. 5

BACKGROUND OF THE INVENTION

Field of the Invention

The invention describes an encapsulated power semiconductor device which is constructed for example as a rectifier circuit or as an inverter circuit, although not limited to these examples.

Description of the Related Art

An encapsulated power semiconductor device having a metal body and two power semiconductor components is known from the prior art, for example disclosed in EP 2 881 985 A1, wherein the power semiconductor components are arranged in a stack-like manner on the metal moulded body. The power semiconductor components are encapsulated by an insulating material, wherein the insulating material also surrounds the connecting lines of the power semiconductor components.

ASPECTS AND SUMMARY OF THE INVENTION

According to one aspect of the present invention, there is provided a power semiconductor device that has a metal moulded body forming a first connecting conductor. A first main surface of the metal moulded body has a first recess having a first base in which a first power semiconductor component is arranged, so that the first power semiconductor component faces the first base and is connected in an electrically conductive manner. From a second main surface of the metal moulded body, a second recess has a second base and a second power semiconductor component is arranged with the first contact surface thereof associated with the second base connected in an electrically conductive manner to this base. An insulating material layer is on both main surfaces, filling and completely covering the recess, wherein the first insulating layer has an electrically conductive first via which connects a fourth contact surface of the first power semiconductor component in an electrically conductive manner to a first conducting surface arranged on the first insulating layer.

According to another alternative aspect of the present invention, there is provided a power semiconductor device constructed with a metal moulded body which forms a first connecting conductor. Starting from the first main surface of the metal moulded body, a first recess having a first base is formed, in which a first power semiconductor component is arranged, wherein the first contact surface thereof, which faces the first base, is connected in an electrically conductive manner to this base. Starting from the second main surface of the metal moulded body, a second recess having a second base is formed, in which a second power semiconductor component is arranged, wherein the first contact surface thereof, which is associated with the second base, is connected in an electrically conductive manner to this base. A respective insulating material layer is arranged on both main surfaces, filling and completely covering at least the respective recess, wherein the first insulating layer has an electrically conductive first via which connects a second contact surface of the first power semiconductor component in an electrically conductive manner to a first conducting surface arranged on the first insulating layer and wherein the second insulating layer has an electrically conductive second via which connects a second contact surface of the second power semiconductor component in an electrically conductive manner to a second conducting surface arranged on the second insulating layer.

With knowledge of these said factors in the prior section, the invention is based on the object of providing an encapsulated power semiconductor device which develops the prior art in particular in terms of enabling efficient cooling and a symmetrical arrangement.

This object is achieved according to the invention by a power semiconductor device having the features of claim 1. Preferred embodiments are described in the dependent claims.

According to the invention, the encapsulated power semiconductor device is constructed with a metal moulded body which forms a first connecting conductor. Starting from the first main surface of the metal moulded body, a first recess having a first base is formed, in which a first power semiconductor component is arranged, wherein the first contact surface thereof, which faces the first base, is connected in an electrically conductive manner to this base. Starting from the second main surface of the metal moulded body, a second recess having a second base is formed, in which a second power semiconductor component is arranged, wherein the first contact surface thereof, which is associated with the second base, is connected in an electrically conductive manner to this base. A respective insulating material layer is arranged on both main surfaces, filling and completely covering at least the respective recess, wherein the first insulating layer has an electrically conductive first via which connects a second contact surface of the first power semiconductor component in an electrically conductive manner to a first conducting surface arranged on the first insulating layer and wherein the second insulating layer has an electrically conductive second via which connects a second contact surface of the second power semiconductor component in an electrically conductive manner to a second conducting surface arranged on the second insulating layer.

The first connecting conductor preferably forms an AC voltage connection, whilst the first and second conducting surfaces form further connecting conductors which form the DC voltage connections.

It is preferred if at least one of the power semiconductor components is in thermal contact with an associated cooling device which is arranged on the side of this conducting surface which is remote from the metal moulded body and is preferably insulated therefrom by means of an electrically insulating interlayer. In particular, the respective insulating layer and the associated insulating interlayer can be a common insulating layer.

It can be advantageous if the first power semiconductor component has a first further contact surface which faces the base of the first recess and is preferably constructed as a control contact surface, and wherein a first further via, which is electrically insulated from the metal moulded body, is associated with this first further contact surface, which first further via connects this first further contact surface in an electrically conductive manner to a first further conducting surface arranged on the second insulating layer.

It can also be advantageous if the second power semiconductor component has a second further contact surface which is remote from the second base of the second recess and is preferably constructed as a control contact surface, and wherein a second further via is associated with this second further contact surface, which second further via connects this second further contact surface in an electrically conductive manner to a second further conducting surface arranged on the second insulating layer.

A preferred embodiment is realized if the second conducting surface, the first further conducting surface and the second further conducting surface are formed from a metal foil forms mutually electrically insulated conducting tracks, pathways, conduits, vias, or other electrically conducting connection pathways. The conducting tracks of the metal foil can be covered here on the side remote from the metal moulded body by an insulating material foil. Furthermore, both foils can be adhesively connected to one another.

It is particularly preferred if the first and second further conducting surfaces are connected to a control device for controlling the power semiconductor components.

It can be advantageous if the metal moulded body has a cavity for cooling the power semiconductor components. The cavity here can form part of a heat pipe. The cavity can alternatively be designed for a liquid or gaseous coolant to flow through it.

It goes without saying that, as long as this is not ruled out per se, the features mentioned in the singular can be present multiple times in the power semiconductor device according to the invention. By way of example, the said first and second power semiconductor components refer in each case to at least one power semiconductor component. Similar power semiconductor components can therefore be present multiple times; in particular, a power semiconductor component can also be constructed as a parallel circuit of two different power semiconductor components, in particular as a parallel circuit of a power transistor with a free-wheeling diode. The respective pathways, conduits or vias are likewise preferably present multiple times.

It goes without saying that, to achieve improvements, the different embodiments of the invention can be realized individually or in any combinations which are not ruled out per se. In particular, the features mentioned and explained above and below may be used not only in the combinations indicated but also in other combinations or in isolation without deviating from the scope of the present invention.

Further explanations of the invention, advantageous details and features, are revealed in the description below of the exemplary embodiments of the invention, which are illustrated schematically in FIGS. 1 to 6, or of respective parts thereof.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
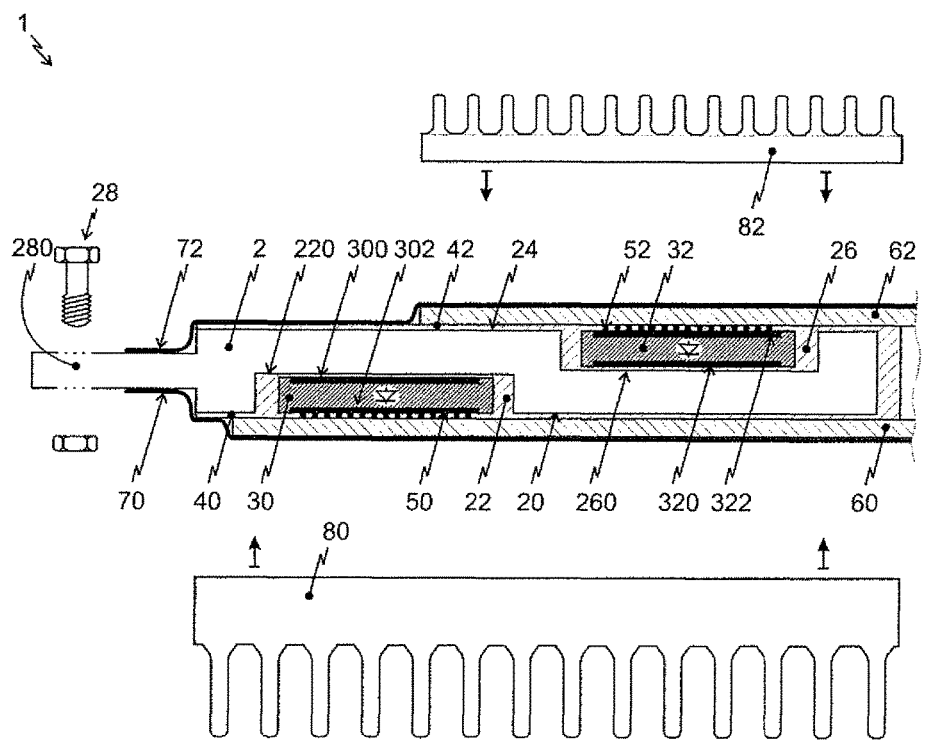
FIGS. 1 to 4 show sectional views of different embodiments of a power semiconductor device according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

It will be further understood by those of skill in the art that the apparatus and devices and the elements herein, without limitation, and including the sub components such as operational structures, circuits, communication pathways, and related elements, control elements of all kinds, display circuits and display systems and elements, any necessary driving elements, inputs, sensors, detectors, memory elements, processors and any combinations of these structures etc. as will be understood by those of skill in the art as also being identified as or capable of operating the systems and devices and subcomponents noted herein and structures that accomplish the functions without restrictive language or label requirements since those of skill in the art are well versed in related devices, computer and operational controls and technologies of such devices and all their sub components, including various circuits and combinations of circuits without departing from the scope and spirit of the present invention.

FIG. 1 shows a first embodiment of a power semiconductor device 1 according to the invention in the form of a single-phase rectifier circuit. A metal moulded body 2 of copper or another material with a low specific resistance is shown, which forms a first connecting conductor—here that of the AC voltage connection. The external connection is represented here by a screw connection 28 through an associated receiving means 280 without being restricted thereto. In this embodiment of the metal moulded body 2, this has a first main surface 20 and a second main surface 24, which is parallel to said first main surface, wherein the metal moulded body 2 has a thickness, i.e. a mutual spacing of the main surfaces 20, 24, of 1.2 mm. Thicknesses of the metal moulded body 2 of between 0.8 mm to 2 mm are preferred, with thicknesses of between 0.5 mm and 0.8 mm or even beyond 2 mm also being possible depending on further parameters.

Starting from the first main surface 20—the lower main surface in this and the further illustrations—a first recess 22 is arranged here. This first recess 22 serves to receive a first power semiconductor component 30, a diode here, and more precisely a power diode. The recess 22 has a depth which preferably corresponds to the thickness of the diode 30, typically between 60 µm and 200 µm, at least up to a few tens of percent. The diode 30 therefore ideally terminates flush with the associated first main surface 22, projects slightly beyond this or is set back slightly from this. The diode 30, and more precisely the first contact surface 300 thereof, is connected in an electrically conductive manner to the first base 220 of the first recess 22, in particular by means of a sintered, soldered or bonded connection.

Starting from the second main surface 24—the upper main surface in this and the further illustrations—a second recess 26 is arranged laterally offset from the first recess 22. A second power semiconductor component 32, a second power diode here, is arranged in this second recess 26 analogously to the first recess 22.

As shown, a thin insulating layer 40, 42 is arranged on the entire first and second main surface 20, 24 with the exception of the region for the external connection. The material of this insulating layer 40, 42 is preferably a printed circuit board base material which is customary according to the state of the art, for example epoxy or phenol resin, and additionally fills the free volume regions of the respective recesses 22, 26 and also completely covers the power semiconductor component 30, 32 arranged respectively in this recess 22, 26. The material of the insulating layer 40, 42 can furthermore also fully or partially cover at least one lateral surface of the metal moulded body 2, as shown here.

A first conducting surface 60, which in this case forms a connecting conductor, more precisely a DC voltage connection at a negative potential, is arranged on a portion of the first insulating layer 40, thereby electrically insulated from the metal moulded body 2. For the electrical connection of this first conducting surface 60 to the second contact surface 302 of the first power semiconductor component 30, first vias 50 (pathway or portion 50, etc.) are arranged in the intermediate first insulating layer 40. By way of example, these vias (or pathways or portions) are manufactured by laser drilling through the first conducting surface and the first insulating layer and subsequently galvanizing the holes produced.

For the external electrical insulation of the first conducting surface 60, a first insulating interlayer 70 is furthermore arranged such that it covers the first conducting surface 60 and also the first insulating layer 40 here and part of the region for the external connection.

A second conducting surface 62, which forms a connecting conductor here, and more precisely a DC voltage connection at a positive potential, is arranged on a portion of the second insulating layer 42, thereby electrically insulated from the metal moulded body 2. For the electrical connection of this second conducting surface 62 to the second contact surface 322 of the second power semiconductor component 32, second vias 52 (or pathway) are arranged in the intermediate second insulating layer 42. These vias are manufactured as described above.

For the external electrical insulation of the second conducting surface 62, a second insulating interlayer 72 is furthermore arranged such that it covers the conducting surface 62 and also the second insulating layer 42 here and part of the region for the external connection.

To dissipate the heat produced by line and switching losses in the power semiconductor components 30, 32, a respective cooling device 80, 82 is arranged here on the first and second insulating layer 70, 72, which cooling device is constructed in each case as an air cooling device and is in each case aligned with the associated power semiconductor component 30, 32 and projects beyond this on all sides.

Figure 3:
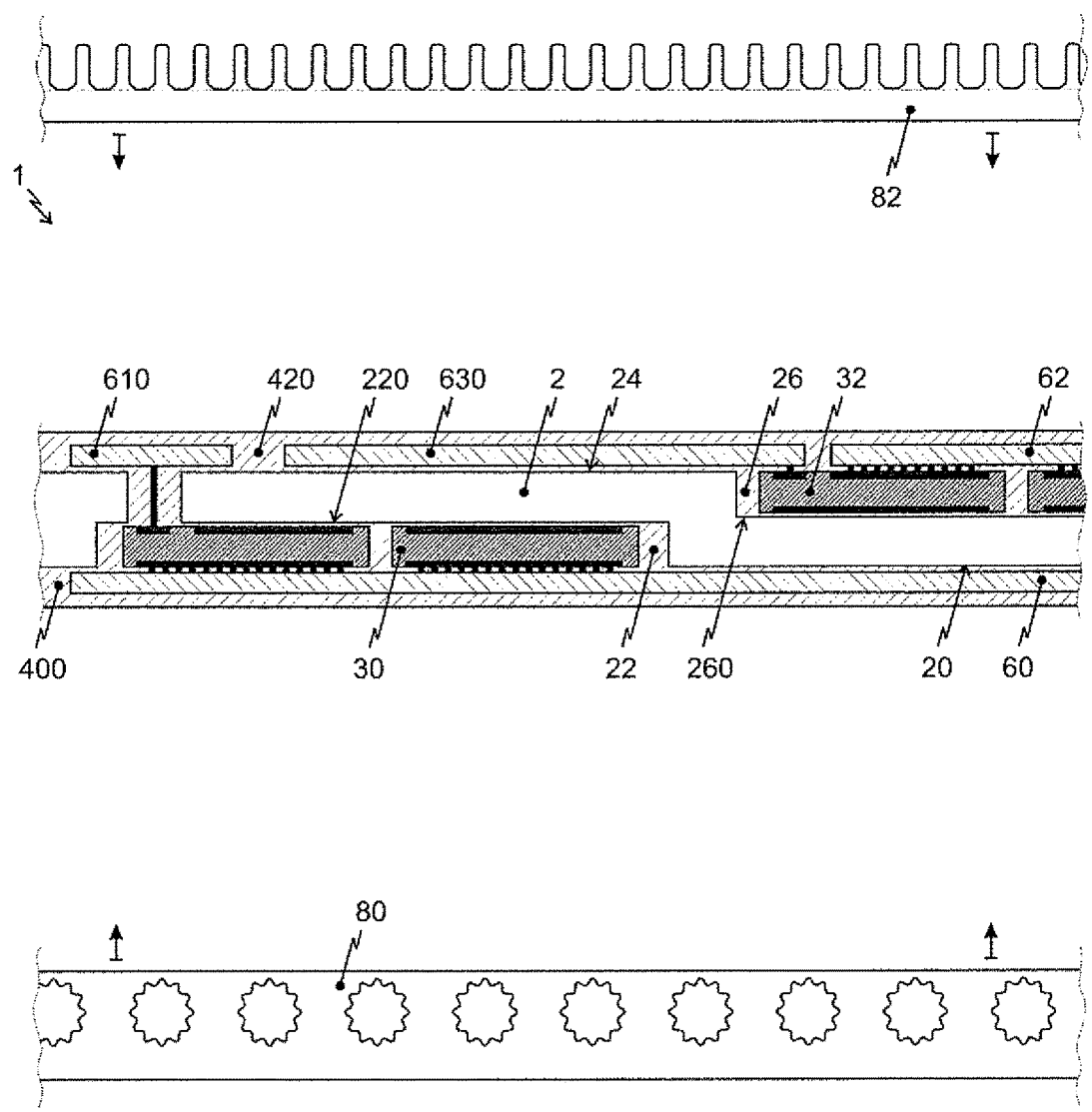

It can be advantageous if the power semiconductor device 1 has only one, preferably the second, cooling device 82, then the first cooling device 80 can be selected specifically within the context of the application of the power semiconductor device 1, c.f. FIG. 3.

Figure 2:
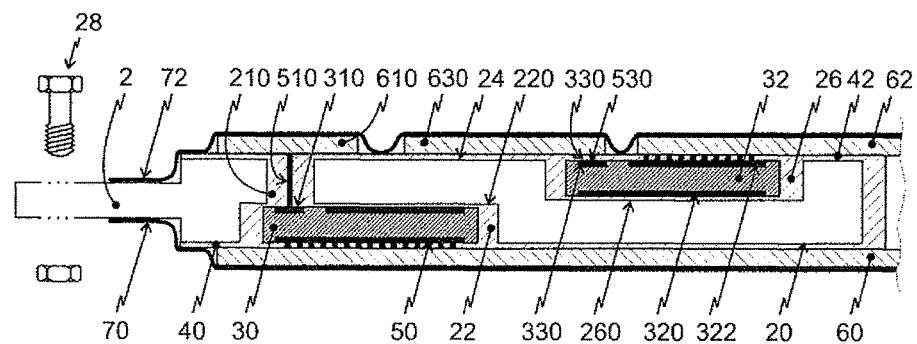

FIG. 2 shows a second embodiment of a power semiconductor device 1 according to the invention in the form of a half-bridge inverter circuit in which the power semiconductor components 30, 32 are designed as field effect transistors and each have a further contact surface 310, 330, a control contact surface.

The metal moulded body 2 with its recesses 22, 26 is essentially constructed in a manner similar to that according to FIG. 1. However, the metal moulded body 2 here additionally has a further recess 210, which reaches from the first base 220 of the first recess 22 to the second main surface 24 and is filled with the material of the insulating layer 40, 42 and in which a first further via 510 is constructed, which first further via is electrically insulated from the metal moulded body 2.

This first further via 510 connects the control connection, which is arranged on the side facing the first base 220 of the first recess 22, and therefore the first further contact surface 310 of the first power semiconductor component 30, to a first further conducting surface 610 arranged on the second main surface 24 and electrically insulated therefrom by means of the second insulating material 42.

A second further conducting surface 630 is likewise arranged on the second main surface 24 and electrically insulated therefrom. This second further conducting surface is connected in an electrically conductive manner to the control connection, which is arranged on the side of the power semiconductor component 32 which is remote from the second base 260 of the second recess 26 and thereby forms the second further contact surface 330 of the second power semiconductor component 32, by means of a second further via 530 through the second insulating layer 42. This first and second further conducting surface 610, 630 therefore serves to control the respective power semiconductor component 30, 32 of the power semiconductor device.

In this embodiment, the first and second insulating layer 40, 42 are a single insulating layer which moreover also forms the electrical insulation from other potentials of all vias.

FIG. 3 shows a third embodiment of a power semiconductor device 1 according to the invention in the form of a half-bridge inverter circuit in which the power semiconductor components 30, 32 are constructed as power transistors with anti-parallel connected power diodes, wherein each power transistor has a respective further contact surface 310, 330, a control contact surface, analogously to the field effect transistors according to FIG. 2. The two mutually associated power semiconductor components, i.e. the power transistor and the antiparallel-connected power diode, are each arranged in a common recess.

All the vias are essentially constructed in the same manner as that already described under FIGS. 1 and 2.

It is essential here, however, that, in contrast to FIGS. 1 and 2, the first and second insulating layer 40, 42 and also the insulating interlayer 70, 72 form a single insulating layer which consists of the material of the insulating layers. However, this insulating layer is preferably not formed in one operating step but in a sequence of a plurality of operating steps. By way of example, there are respective intermediate steps for forming vias and arranging conducting surfaces. In particular, the insulating layer here also forms the electrical insulation from other potentials of all vias. The insulating layer, as well as the vias or the connections to the conducting surfaces, are preferably formed by means of current techniques used in the manufacture of printed circuit boards, which techniques are customary according to the state of the art.

Furthermore a first and second cooling device 80, 82 are shown at a spacing for reasons of clarity. The second cooling device 82 is again constructed as an air cooling device here, wherein it is arranged electrically insulated from all potentials of the power semiconductor device and covers substantial regions of the second main surface 24. The first cooling device 80, which is preferably only arranged upon use, is constructed as a liquid cooling device and is arranged with respect to the first main surface 20 and electrically insulated therefrom.

Figure 4:
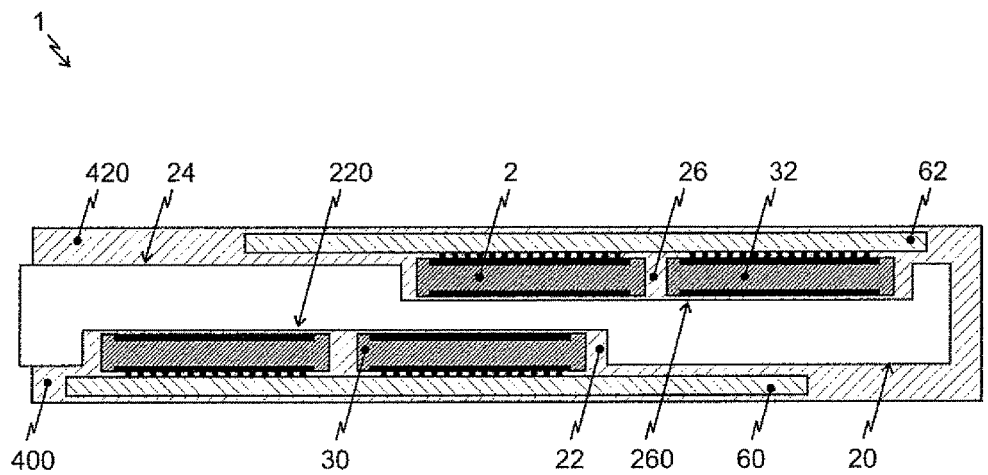

FIG. 4 shows a fourth embodiment of a power semiconductor device 1 according to the invention in the form of a single-phase rectifier circuit in which the first and second power semiconductor components 30, 32 are designed as two parallel-connected power diodes. These two respective power diodes are each arranged in a common recess 22, 26. The first recess 22 of the first main surface 20 is not completely offset from the second recess 26 of the second main surface 24 here. The embodiment of the metal moulded body 2 otherwise corresponds to that according to FIG. 1.

The embodiment of the first and second conducting surface 60, 62, as well as the insulating layer as such having the first and second vias 50, 52, corresponds to that according to FIG. 3.

Figure 5:
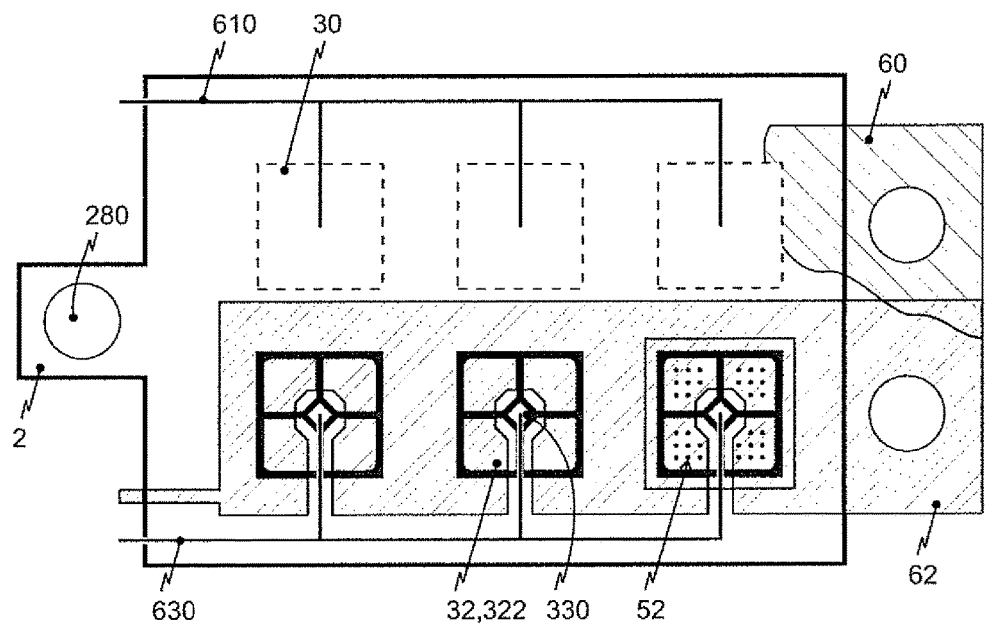
FIG. 5 shows a plan view of a power semiconductor device according to the invention.

FIG. 5 shows a plan view in the direction of the second main surface 22 of a power semiconductor device according to the invention. A first conducting surface 60, first power semiconductor components 30, a metal moulded body 2, second power semiconductor components 32 arranged in second recesses 220, a second conducting surface 62 and a first and a second further conducting surface 610, 630 are shown, as it were, from the bottom up.

For reasons of clarity, the first recesses, as well as the insulating layer in the sense of FIGS. 3 and 4, and a first and second cooling device have not been shown.

Figure 6:
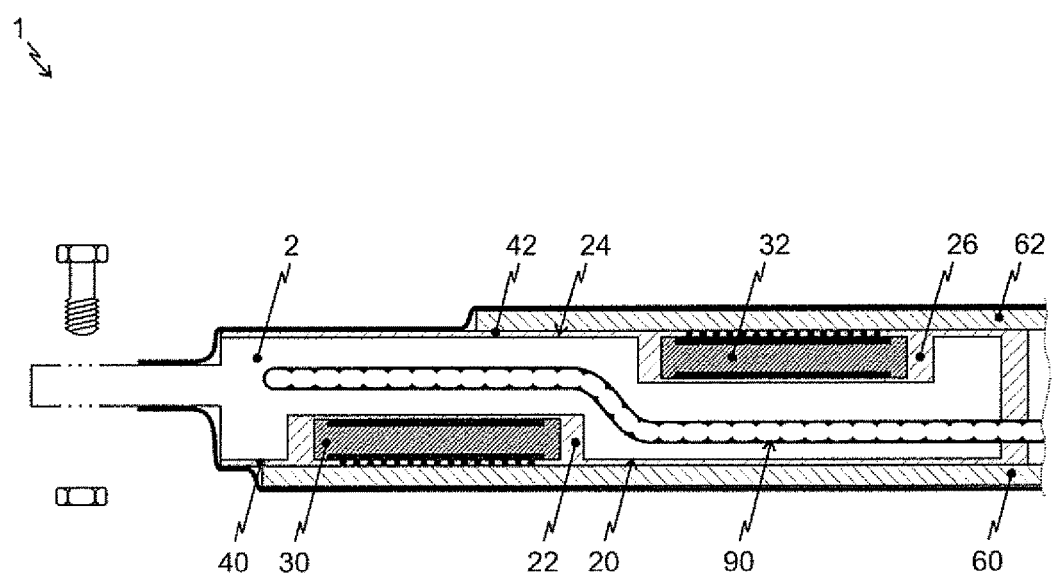
FIG. 6 shows a sectional view of a development of a first embodiment of the power semiconductor device according to the invention.

FIG. 6 shows a sectional view of a development of the first embodiment of the power semiconductor device 1 according to the invention. The metal moulded body 2 here is developed in such a way that it has a cavity 90 in the interior for cooling the power semiconductor components 30, 32. Alternatively, the cavity 90 can also be part of an air or liquid cooling system and have cooling fins or cooling fingers (not shown) for this purpose. An essential advantage of the cooling of the metal moulded body 2 achieved thereby is that the heat transfer to the power semiconductor components 30, 32 can be effected by a metal material, for example solder, and the thermal resistance during this transfer is thereby lower than for an insulating material.

This cavity together with the associated further cooling device can additionally be present for the first or second or both cooling devices. The efficient cooling thereof is due in particular to the fact that the thickness and therefore the thermal resistance of the layers of insulating material are designed to be as slight as possible without neglecting the electrical reliability.

Although only a few embodiments have been disclosed in detail above, other embodiments are possible and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art.

Also, the inventors intend that only those claims which use the words "means for" are intended to be interpreted under 35 USC 112, sixth paragraph. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. An encapsulated power semiconductor device, comprising:
 a metal moulded body which forms a first connecting conductor;
 wherein, starting from a first main surface of the metal moulded body, a first recess having a first base is formed, in which a first power semiconductor component is arranged; wherein the first power semiconductor component has a first contact surface thereof and which is associated with the first base, and is connected in an electrically conductive manner to said first base;
 wherein, starting from a different second main surface of the metal moulded body, a second recess having a second base is formed, in which a second power semiconductor component is arranged; wherein the second power semiconductor component has a second contact surface and is associated with the second base, and is connected in an electrically conductive manner to said second base;
 a respective first insulating layer and second insulating layer is arranged on each respective first main surface and second main surface, each filling and completely covering respectively the at least first recess and second recess;
 the first insulating layer has an electrically conductive first via which connects the second contact surface of the first power semiconductor component in an electrically conductive manner to a first conducting surface arranged on the first insulating layer and wherein the second insulating layer has an electrically conductive second via which connects a third contact surface of the second power semiconductor component in an electrically conductive manner to a second conducting surface arranged on the second insulating layer;
 wherein the first connecting conductor forms an AC voltage connection;

wherein the first and second conducting surface form further connecting conductors which form DC voltage connections; and wherein at least one of the first and second conducting surfaces is in a thermal contact with a respective first and second associated cooling device which is arranged, respectively, on a first side or a second side of said respective first and second conducting surface and which is remote from the metal moulded body and which is electrically insulated therefrom by respective first and second electrically insulating interlayers.

2. The encapsulated power semiconductor device according to claim 1, wherein:

one of said first and second respective insulating layers and said associated first and second insulating interlayer form a common first and second insulating layer at a location therealong.

3. The encapsulated power semiconductor device, according to claim 1, wherein:

the first power semiconductor component has a first further contact surface which faces the first base of the first recess and is constructed as a first control contact surface, and wherein a first further via, which is electrically insulated from the metal moulded body, is associated with the first further contact surface, said first further via connects the first further contact surface in an electrically conductive manner to a further first conducting surface arranged on the second insulating layer.

4. The encapsulated power semiconductor device, according to claim 1, wherein:

the second power semiconductor component has a second further contact surface which is remote from the base (260) of the second recess and is constructed as a second control contact surface, and wherein a second further via is associated with the second further contact surface, in an electrically conductive manner to a further second conducting surface arranged on the second insulating layer.

5. The encapsulated power semiconductor device, according to claim 4, wherein:

the second conducting surface, the first further conducting surface and the second further conducting surface are formed from a first metal foil which is structured to form mutually electrically insulated conducting tracks.

6. The encapsulated power semiconductor device, according to claim 5, wherein:

the conducting tracks of the first metal foil are covered on the side remote from the metal moulded body by a first insulating material foil, and both first metal foil and said first insulating material foil are adhesively connected to one another.

7. The encapsulated power semiconductor device, according to claim 6, wherein:

the first and the second further conducting surfaces are connected to a control device for controlling the first and second power semiconductor components.

8. The encapsulated power semiconductor device, according to claim 7, wherein:

the metal moulded body has a cavity for cooling the power semiconductor components.

9. The encapsulated power semiconductor device, according to claim 8, wherein:

the cavity forms part of a heat pipe.

10. The encapsulated power semiconductor device, according to claim 8, wherein:

the cavity is operable for one of a liquid or a gaseous coolant to flow through it during a use of said device.

* * * * *